(12) United States Patent
Kim et al.

(10) Patent No.: US 6,656,282 B2
(45) Date of Patent: Dec. 2, 2003

(54) ATOMIC LAYER DEPOSITION APPARATUS AND PROCESS USING REMOTE PLASMA

(75) Inventors: Yong-Il Kim, ChonAn (KR);
Won-Hyung Lee, ChonAn (KR);
Byung-Ha Cho, DaeJeon-Mage (KR)

(73) Assignee: Moohan Co., Ltd., ChonAn (KR)

( * ) Notice: Subject to any disclaimer, the term of this patent is extended or adjusted under 35 U.S.C. 154(b) by 23 days.

(21) Appl. No.: 09/973,760

(22) Filed: Oct. 11, 2001

(65) Prior Publication Data

US 2003/0070617 A1 Apr. 17, 2003

(51) Int. Cl.[7] ................. C23C 16/00; H05H 1/00; H05H 1/02
(52) U.S. Cl. .............. 118/695; 118/702; 118/715; 118/726; 118/723 ME; 118/723 ER; 118/723 IR; 156/345.26; 156/345.24; 427/569
(58) Field of Search ................. 118/695, 715, 118/726, 723 ME, 723 ER, 723 IR, 712, 702; 427/569, 562, 585; 156/345.24, 345.26

(56) References Cited

U.S. PATENT DOCUMENTS 5,262,199 A * 11/1993 Desu et al. ............. 427/255.32
6,325,017 B1 * 12/2001 DeBoer et al. ......... 118/723 R
6,360,685 B1 * 3/2002 Xia et al. ............ 118/723 ME

* cited by examiner

*Primary Examiner*—Parviz Hassanzadeh
(74) *Attorney, Agent, or Firm*—Robert E. Bushnell, Esq.

(57) ABSTRACT

Disclosed are an apparatus for and a process of atomic layer deposition using remote plasma. A thin film is deposited to a desired thickness on a wafer by use of the apparatus, which comprises a plurality of transfer pipes for individually transferring the first and the second reactive gas and the carrier gas to the vacuum chamber; an energy supplier, provided inside the transfer pipe for transferring the first and the second reactive gas, for supplying excitation energy to generate excited plasma to ionize the first reactive gas; and a valve controller, established in the transfer pipes, for alternately feeding into the vacuum chamber the second reactive gas and the first reactive gas ionized by the plasma excited in the energy supplier, at predetermined time intervals.

15 Claims, 5 Drawing Sheets

| | | 1 | 2 | 3 | 4 | 5 | 6 |
|---|---|---|---|---|---|---|---|
| | | Initial process | | Feeding A(TaCl₅) | Purge A | Feeding B(NH3) | Purge B |
| V1 | OPEN | | ▀▀▀▀▀▀▀▀▀▀▀▀ | | | | ▀▀▀ |
| | CLOSE | ▀▀▀ | | | | ▀▀▀ | |
| V2 | OPEN | ▀▀▀▀▀▀▀▀ | | | ▀▀▀▀▀▀▀▀▀▀▀▀ | | |
| | CLOSE | | | ▀▀▀ | | | ▀▀▀ |
| V3 | OPEN | | | ▀▀▀ | | | |
| | CLOSE | ▀▀▀▀▀▀▀▀ | | | ▀▀▀▀▀▀▀▀▀▀▀▀ | | |
| V4 | OPEN | ▀▀▀▀▀▀▀▀ | | | ▀▀▀▀▀▀▀▀▀▀▀▀ | | |
| | CLOSE | | | ▀▀▀ | | | ▀▀▀ |
| V5 | OPEN | ▀▀▀▀▀ | | | | ▀▀▀▀▀▀▀▀ | |
| | CLOSE | | | ▀▀▀▀▀▀▀ | | | ▀▀▀ |
| V6 | OPEN | | ▀▀▀▀▀▀▀▀▀▀▀▀▀▀▀▀▀▀▀▀ | | | | |
| | CLOSE | ▀▀▀ | | | | | ▀▀▀ |
| V7 | OPEN | | | | | ▀▀▀ | |
| | CLOSE | ▀▀▀▀▀▀▀▀▀▀▀▀▀▀▀▀ | | | | | ▀▀▀ |
| V8 | OPEN | ▀▀▀▀▀▀▀▀▀▀▀▀▀▀▀▀ | | | | | ▀▀▀ |
| | CLOSE | | | | | ▀▀▀ | |
| V9 | OPEN | ▀▀▀ | | | ▀▀▀▀▀▀▀▀ | | |
| | CLOSE | | ▀▀▀▀▀▀▀▀▀▀▀▀ | | | | ▀▀▀ |
| V10 | OPEN | ▀▀▀ | | | | | ▀▀▀ |
| | CLOSE | | ▀▀▀▀▀▀▀▀▀▀▀▀▀▀▀▀▀▀▀▀ | | | | | t1　t2　t3　t4　t5　t6

ATOMIC LAYER DEPOSITION APPARATUS AND PROCESS USING REMOTE PLASMA

BACKGROUND OF THE INVENTION

1. Field of the invention

The present invention relates to atomic layer deposition. More particularly, the present invention relates to an apparatus for and process of depositing a thin film on a wafer through atomic layer deposition using remote plasma.

2. Description of the Invention

In general, a semiconductor device is fabricated after conducting a wafer process, an epitaxy process, a thin film deposition process, a diffusion/ion implantation process, a photolithography process, and an etching process. For example, siliceous materials, such as sand, are formed through polycrystalline ingots into monocrystalline wafers which are then subjected to an epitaxy process that involves the deposition of silicon or silicon compounds on the wafer continuing and perfecting the crystal structure of the bare wafer underneath. After the deposition of various thin layers according to their uses, ions are implanted into the wafer and diffused to form devices, followed by dicing the wafer into individual chips. A leadframe is provided to each semiconductor chip which is then sealed with, for example, resin.

At every semiconductor fabrication process are formed various thin films, which are usually classified into four categories: oxides ($SiO_2$) for gate oxides or field oxides; nitrides ($Si_3N_4$) for insulation between conductive layers or as masks or element-protecting films upon diffusion/ion implantation; polysilicon films (poly-Si) as gate electrodes instead of metal; and metallic films as electrodes for interconnecting elements to elements or connecting elements to external terminals.

In most cases of forming oxide, nitride and metal thin films, chemical vapor deposition (CVD) is employed. In the semiconductor industry, CVD is useful to form a dense structural part or coating onto a wafer using the decomposition of relatively high vapor pressure gas in a chamber. Gaseous compounds of the materials to be deposited are transported to a substrate surface where a thermal reaction/deposition occurs. Thus far, various CVD methods have been developed as exemplified by atmospheric pressure CVD (APCVD), low pressure CVD (LPCVD), plasma enhanced CVD (PECVD), and energy CVD. In any case, the thin film deposited on the substrate should be low in impurities and constant in thickness. Particularly, application of CVD for deposition of metal films results in good step coverage and uniform thickness. In addition, CVD can form metal films on a plurality of wafers. Such a deposition step is very important because it is conducted at almost every semiconductor fabrication step.

Recently, active research has been directed to the application of atomic layer deposition (ALD), a kind of CVD, characterized by the low impurity concentration and constant thickness of the layer deposited, for the fabrication of semiconductor devices.

In conventional ALD, different reactive gases contained in a carrier are alternately fed at predetermined time intervals using a typical bubble method, whereby reaction materials can be transferred to a vacuum chamber where desired metal layers or oxide or nitride films are deposited on wafers. Reactive gases are fed one by one into the vacuum chamber in an alternating manner to form atomic layers on wafers, thereby reducing impurity concentration and controlling the thin film to a desired thickness.

However, such conventional ALD is problematic in that a high temperature is required to heat the reactive material to a suitable temperature or to supply the reactive material with the necessary activation energy and thus, impure thin films are formed to decrease the production yield.

SUMMARY OF THE INVENTION

It is therefore an object of the present invention to overcome problems encountered in prior arts and to provide an apparatus for and a process of forming a thin film through atomic layer deposition using remote plasma, which allows the supply of reactive materials (reaction radicals) at such low temperatures as to deposit oxide, nitride and metal thin films almost free of impurities.

In accordance with a first embodiment of the present invention, there is provided an apparatus for depositing a thin film using remote plasma, in which a first reactive gas and a second reactive gas is fed with the aid of a carrier gas into vacuum chamber, comprising: a plurality of transfer pipes for individually transferring the first and the second reactive gas and the carrier gas to the vacuum chamber; an energy supplier, provided inside the transfer pipe for transferring the first and the second reactive gas, for supplying excitation energy to generate excited plasma to ionize the first reactive gas; and a valve controller, established in the transfer pipes, for alternately feeding into the vacuum chamber the second reactive gas and the first reactive gas ionized by the plasma excited in the energy supplier at predetermined time intervals.

In one version of the first embodiment, the energy supplier functions as a plasma generator by generating a high frequency to ionize either the first or the second reactive gas to plasma.

In accordance with a second embodiment of the present invention, there is provided an apparatus for depositing a thin film on a wafer in a vacuum chamber using remote plasma, comprising: a plasma generator for ionizing a first reactive gas to plasma with the excitation energy supplied by a high frequency, said first reactive gas containing N or H; a reactive gas feeder for feeding a second reactive gas; a purge gas feeder for feeding an inert gas; a plurality of valves for feeding the first reactive gas and the second reactive gas in an alternating manner alternately and providing an inert gas between the feeding of the first reactive gas and the second reactive gas, said first reactive gas being ionized by the plasma of the plasma generator; and a valve controller for generating control signals to operate the valves in concert.

In one version of the second embodiment, the first reactive gas is $NH_3$ or $H_2$ and the second reactive gas is provided from a solid source of $TaCl_5$ or a liquid source of $TiCl_4$, $Ta(OC_2H_5)_5$, $SiCl_4$ or $Si_2Cl_6$.

In another version of the second embodiment, the excited, first reactive gas and the unexcited second reactive gas are set to be $NH_3$ and $TiCl_4$, respectively, to form a TiN thin film; $NH_3$ and $TaCl_5$ or $Ta(OC_2H_5)_5$, respectively, to form a TaN thin film; $NH_3$ and $SiCl_4$ or $Si_2Cl_6$, respectively, to form an SiN thin film; and $H_2$ and $TaCl_5$ or $Ta(OC_2H_5)_5$, respectively, to form a Ta thin film.

In a further version of the second embodiment, the valves comprises: a first feeding valve unit for feeding the unexcited reactive gas to a wafer placed in a vacuum chamber; a second feeding valve unit for feeding to the wafer the gas ionized by the plasma of the plasma generator; and a purge valve unit for feeding a cleaning gas after the operation of the first feeding valve unit and the second feeding valve unit.

Instill a further version of the second embodiment, the excited gas in the plasma generator, the unexcited reactive gas, and the cleaning gas are provided under the control of the valves, and the thin film is deposited by performing a provision cycle consisting of the sequential feeding of the second reactive gas, the cleansing gas, the first reactive gas, and the cleansing gas, once or many times. Herein, the thin film is formed on the wafer to a thickness of ones of Angstrom after one provision cycle and to a desired thickness after one or more provision cycles.

In accordance with a third embodiment of the present invention, there is provided an atomatic layer deposition process using remote plasma, in which a first reactive gas, a second reactive gas, and a carrier gas are fed into a vacuum chamber, comprising the steps of: feeding the first reactive gas, the second reactive gas, and the carrier gas, individually, into the vacuum chamber; ionizing either the first reactive gas or the second reactive gas to plasma; and controlling the flow of gases in such a way that the first reactive gas and the second reactive gas are fed in an alternating manner and the carrier gas is fed between the feeding of the first reactive gas and the second reactive gas.

In accordance with a fourth embodiment of the present invention, there is provided an atomic layer deposition process using remote plasma, comprising the steps of: ionizing a first reactive gas to plasma by use of a high frequency, the first reactive gas containing N or H; preparing an inert gas; preparing an unexcited, second reactive gas; feeding the first reactive gas, the second reactive gas, and the inert gas in such a way that the first reactive gas and the second reactive gas are provided in an alternating manner and the carrier gas is provided between the feeding of the first reactive gas and the second reactive gas, whereby a thin film is formed to a predetermined thickness on a wafer.

In one version of the fourth embodiment, the first reactive gas is $NH_3$ or $H_2$ and the second reactive gas is provided from a solid source of $TaCl_5$ or a liquid source of $TiCl_4$, $Ta(OC_2H_5)_5$, $SiCl_4$ or $Si_2Cl_6$.

In another version of the fourth embodiment, the feeding step is conducted many times.

In a further version of the fourth embodiment, the excited, first reactive gas and the unexcited second reactive gas are set to be $NH_3$ and $TiCl_4$, respectively, to form a TiN thin film; $NH_3$ and $TaCl_5$ or $Ta(OC_2H_5)_5$, respectively, to form a TaN thin film; $NH_3$ and $SiCl_4$ or $Si_2Cl_6$, respectively, to form an SiN thin film; and $H_2$ and $TaCl_5$ or $Ta(OC_2H_5)_5$, respectively, to form a Ta thin film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

PREFERRED EMBODIMENTS OF THE INVENTION

Below, a description will be given of an atomic layer deposition apparatus and method using remote plasma, in conjunction with the accompanying figures.

Figure 1:
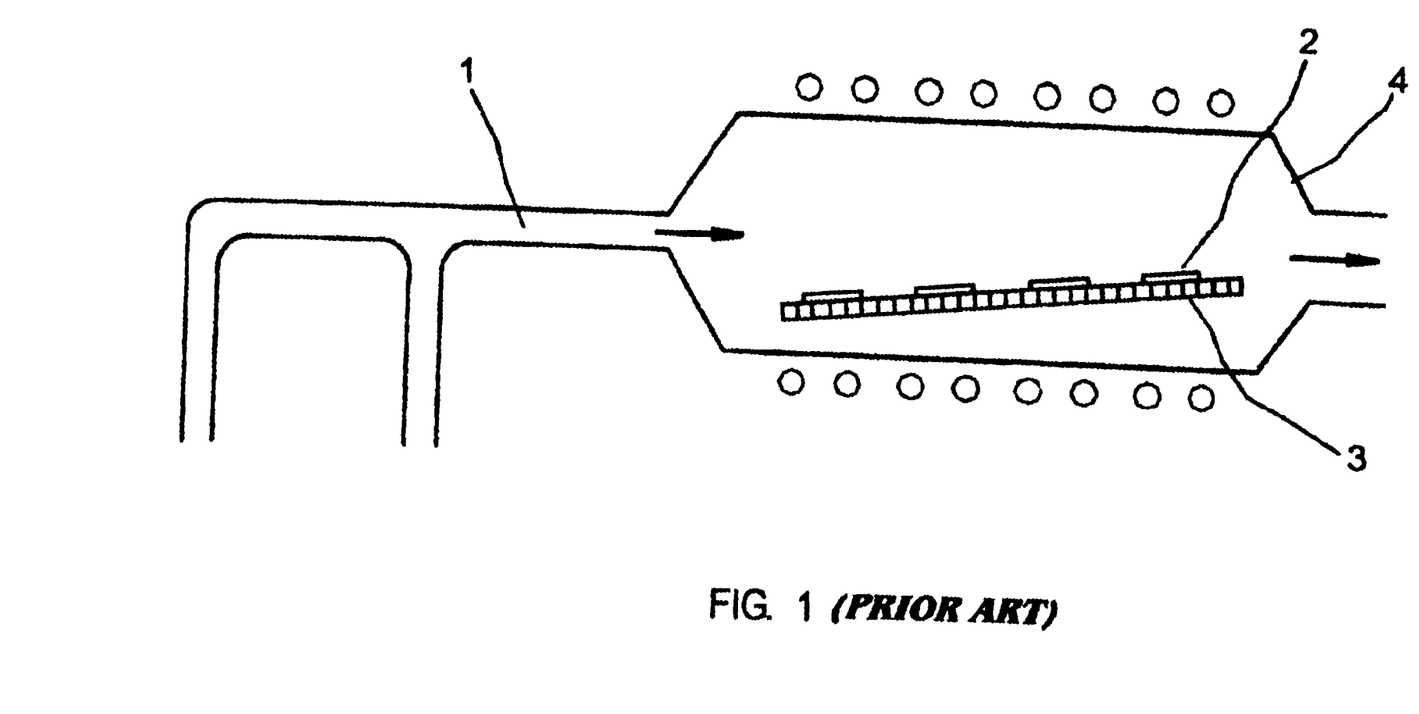
FIG. 1 is a schematic cross sectional view showing a conventional structure of a thin film deposition apparatus.

With reference to FIG. 1, there is schematically shown an essential part of a conventional atomic layer deposition apparatus. As seen in FIG. 1, the conventional atomic layer deposition apparatus comprises a feeder 1 for feeding a plurality of reactive gases alternately, a susceptor 3 for receiving wafers 2, and a chamber 4 for housing the susceptor 3, where the reactive gases fed from the carrier 1 are deposited onto the wafers 2.

Figure 2:
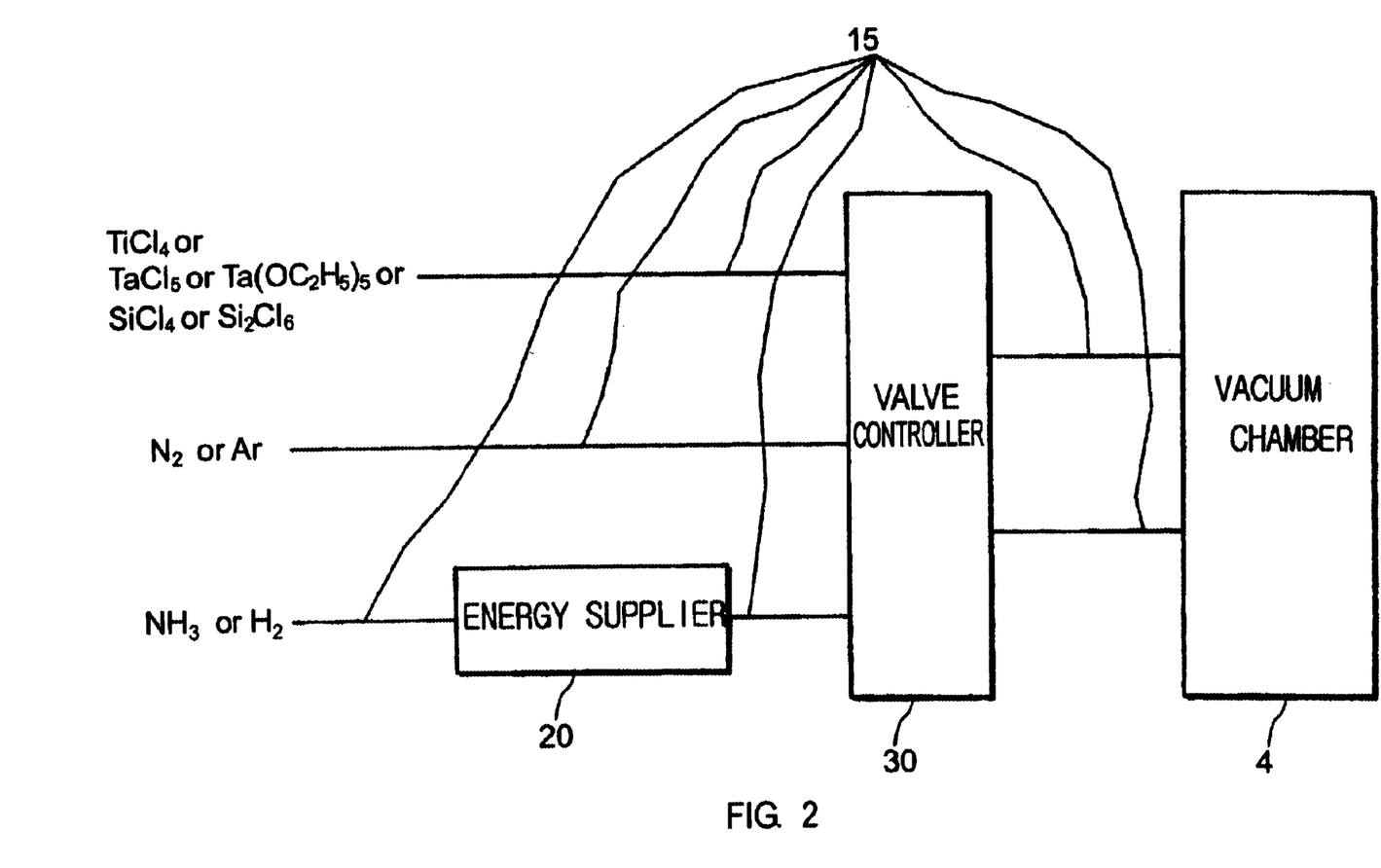
FIG. 2 is a conceptual block diagram showing an atomic layer deposition apparatus using remote plasma, according to the present invention.

With reference to FIG. 2, there is shown a conceptual diagram of a reactive gas feeder for use in the atomic layer deposition apparatus using remote plasma according to the present invention. As shown in the block diagram of FIG. 2, the reactive gas feeder comprises a plurality of transfer pipes 15 for guiding a first reactive gas ($NH_3$ or $H_2$), a second reactive gas ($TiCl_4$, $TaCl_5$, $SiCl_4$, $Si_2Cl_6$), and a carrier gas for carrying the reactive gases, into a vacuum chamber 4; an energy supplier 20, provided inside the transfer pipes 15, for supplying excitation energy to generate excited plasma to ionize the first reactive gas; and a valve controller 30, established in the transfer pipes 15, for alternately feeding into a vacuum chamber 4 the second reactive gas and the first reactive gas ionized by the plasma excited in the energy supplier 20. In the vacuum chamber, the reactive materials are deposited on semiconductor wafers. The energy supplier 20 is a plasma generator where the first reactive gas is ionized by excited plasma using a high frequency of 13.56 MHz with the aid of a radiofrequency (RF) power generator.

In addition to functioning to feed the second reactive gas and the first reactive gas ionized by the plasma, alternately, the valve controller 30 is operated to feed the carrier gas to purge the reactive gas atmosphere at each process after the feeding of the first and second gases.

Figure 3:
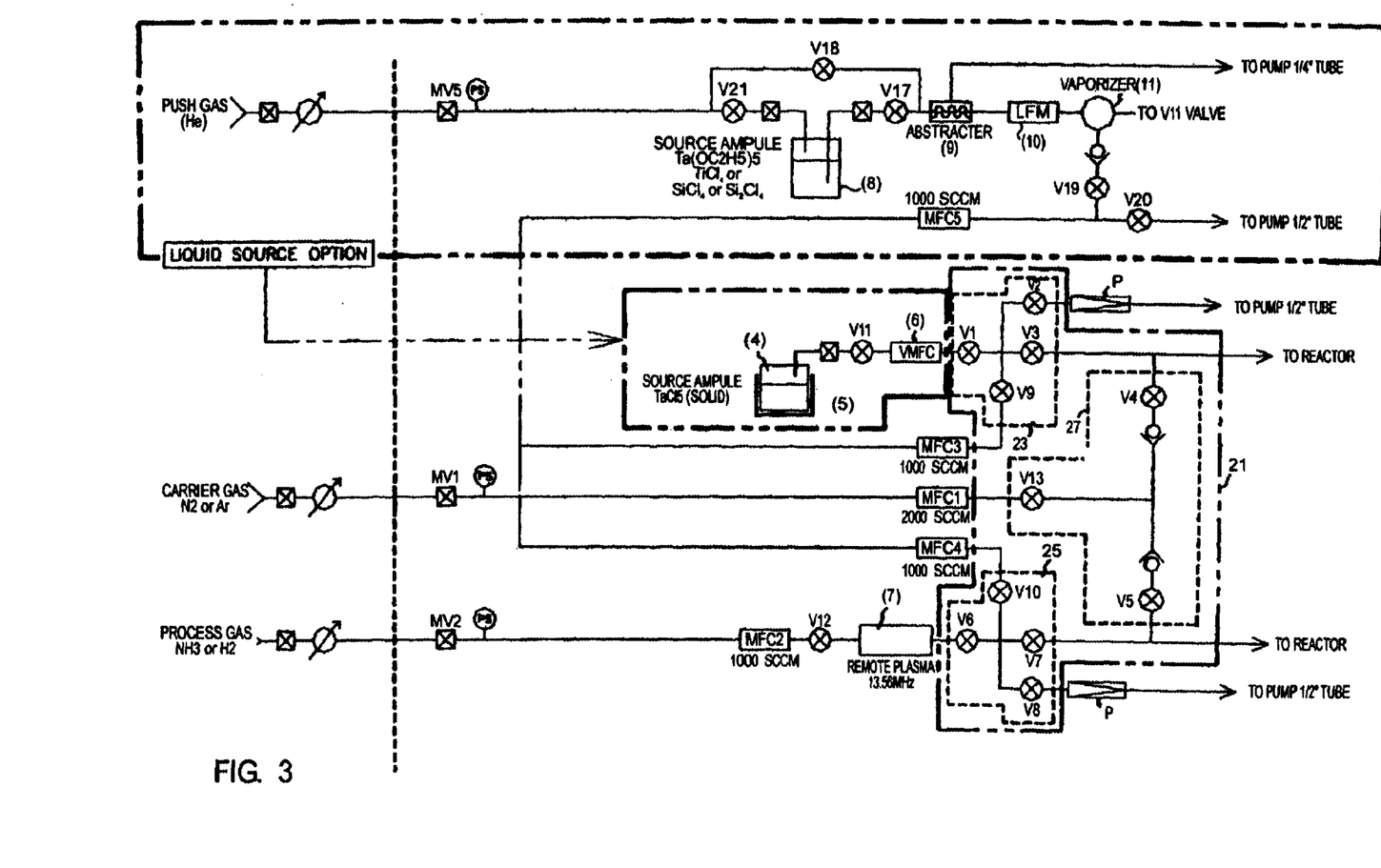
FIG. 3 is a flow diagram corresponding to a reactive gas feeder for use in an atomic layer deposition apparatus using remote plasma in accordance with an embodiment of the present invention.

Turning to FIG. 3, there is shown a flow diagram corresponding to a reactive gas feeder for use in an atomic layer deposition apparatus using remote plasma in accordance with an embodiment of the present invention. As shown, the reactive gas feeder comprises a flow controller 6 for controlling a solid source of the reactive material $TaCl_5$ and the reactive gas generated from the solid source in predetermined quantities, and a first feeding valve unit 23 (V1, V2, V3, V9, V11) for transferring the reactive gas generated with the passage of time to a vacuum chamber or bypass line P.

In addition, the reactive gas feeder comprises a purge valve unit 27 (V4, V5, V13) for supplying inert gas ($N_2$ and Ar) to purge the initially introduced reactive gas out of the vacuum chamber. To the purge valve unit is provided a mass flow controller MFC1 for controlling the flow of carrier gas at a constant amount.

Further, a mass flow controller MFC2 is provided for supplying $NH_3$ or $H_2$ gas sources at a constant flow rate. The reactive gas feeder further comprises a plasma generator 7 for exciting the gas sources to ionization with a high frequency of 13.56 MHz to generate plasma and a second feeding unit 25 (V6, V7, V8, V10) for transferring the gas ionized by the plasma of $NH_3$ through the vacuum chamber or the bypass line P sequentially with time. The first feeding valve unit 23 (V1, V2, V3, V9, V11), the second feeding valve unit 25 (V9, V7, V8, V10), and the purge valve unit 27 (V4, V5, V13), collectively named a valve operating unit 21, function, in concert, to feed the gas ionized by the plasma of the plasma generator 7 and the reactive gas of the reactive gas generator alternately into the chamber and to supply a cleaning gas subsequent to the feeding of any of the reactive gases.

The first feeding valve unit 23 (V1, V2, V3, V9, V11), the second feeding valve unit 25 (V6, V7, V8, V10), and the purge valve unit 27 (V5, V5, V13) are under the control of a valve controller (not shown). The first feeding unit 23 is regulated by the valve controller so as to feed the reactive gas of $TaCl_5$ into the vacuum chamber 4 which is then purged with inert gas such as $N_2$ or Ar according to the operation of the purge valve unit 27 under the control of the valve controller. Likewise, the valve controller regulates the second feeding valve unit 25 and the purge valve unit 27 in such a way that the gas ionized by the plasma of $NH_3$ or $H_2$ is fed into the vacuum chamber 4 which is then purged with inert gas containing $N_2$ or Ar. The gas used to purge the vacuum chamber is a carrier gas. In brief, the first feeding valve unit 23 (V1, V2, V9, V11), the second feeding valve unit 25 (V6, V7, V8, V10), and the purge valve unit 27 (V4, V5, V13) are operated under the control of the valve controller so as to implement a cycle consisting of the feeding of the reactive gas of $TaCl_5$, the purging with inert gas, the feeding of a gas ionized by plasma of $NH_3$ or H2, and the purging with inert gas, in sequence. The cycle may be performed repeatedly according to designed processes. Also, the carrier gas may be supplied, along with the reactive gas of $TaCl_5$ or the gas ionized with plasma of $NH_3$ or $H_2$, in order to quickly carry the reaction materials.

In the case of using a liquid reaction source of $TiCl_4$, $Ta(OC_2H_5)_5$, $SiCl_4$ or $Si_2Cl_6$, instead of the solid source of $TaCl_5$, the reactive gas feeder comprises a container 8 for storing a reaction material by use of pressurized gas, an abstracter 9 for removing the pressurized gas from a pressurized liquid material to carry a pure reactive liquid only, a liquid flow controller 10 for supplying a predetermined amount of the liquid reactive gas source, and an evaporizer 11 for evaporating the carried liquid at a predetermined temperature. The reactive gas induced from the evaporizer 11 is passed through the first feeding valve unit 23 (V1, V2, V3, V9, V11) into the vacuum chamber or bypass line and thus takes part in the operation cycle in concert with the plasma-ionized gas and the purging gas which are regulated by the second feeding valve unit 25 and the purge valve unit 27, respectively.

Figure 4A:
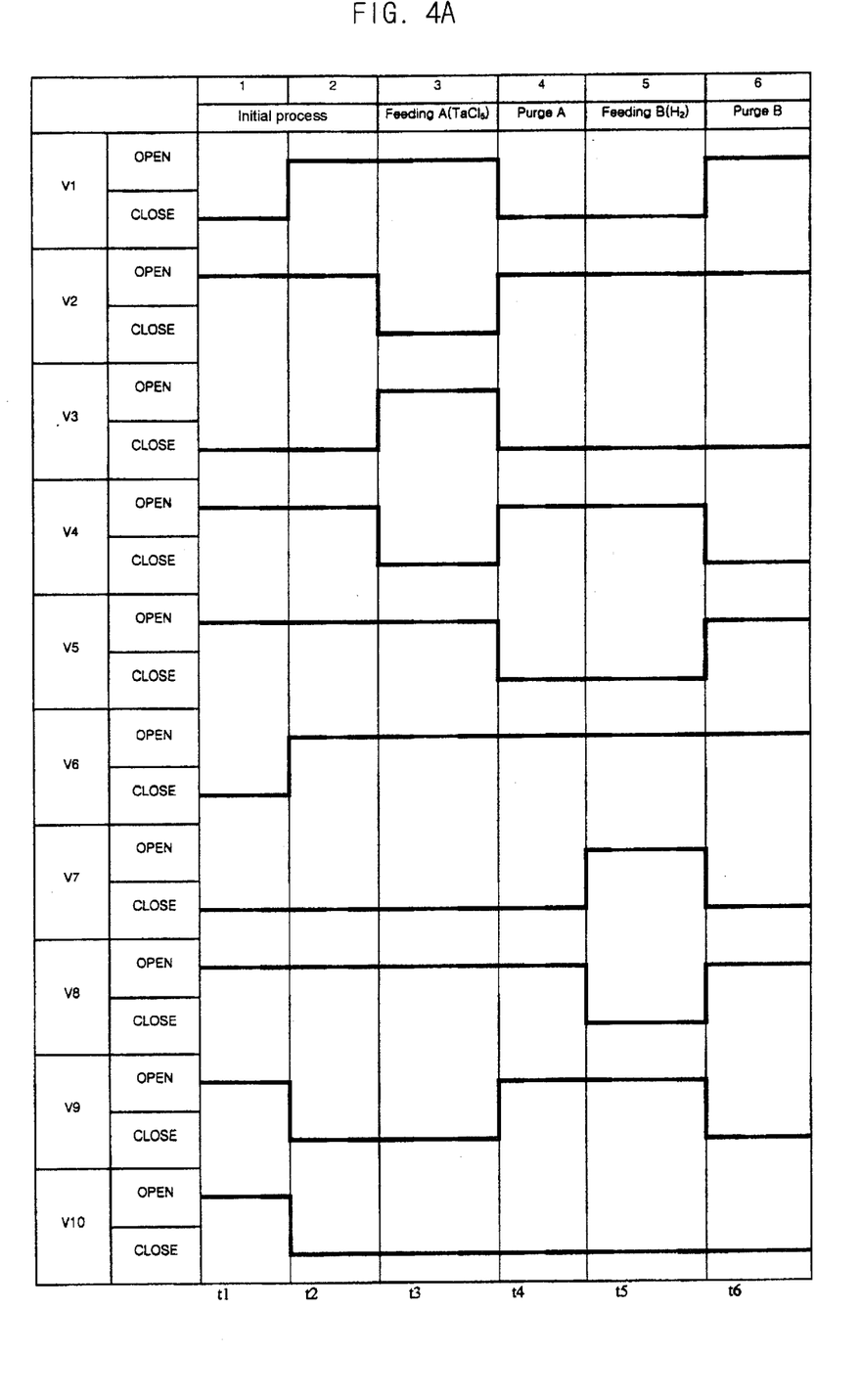
FIGS. 4A and 4B show the operation of the apparatus of the present invention in terms of the operational (open/close) states of the controllers according to the time sequence for supplying reaction materials stepwise.
Figure 4B:
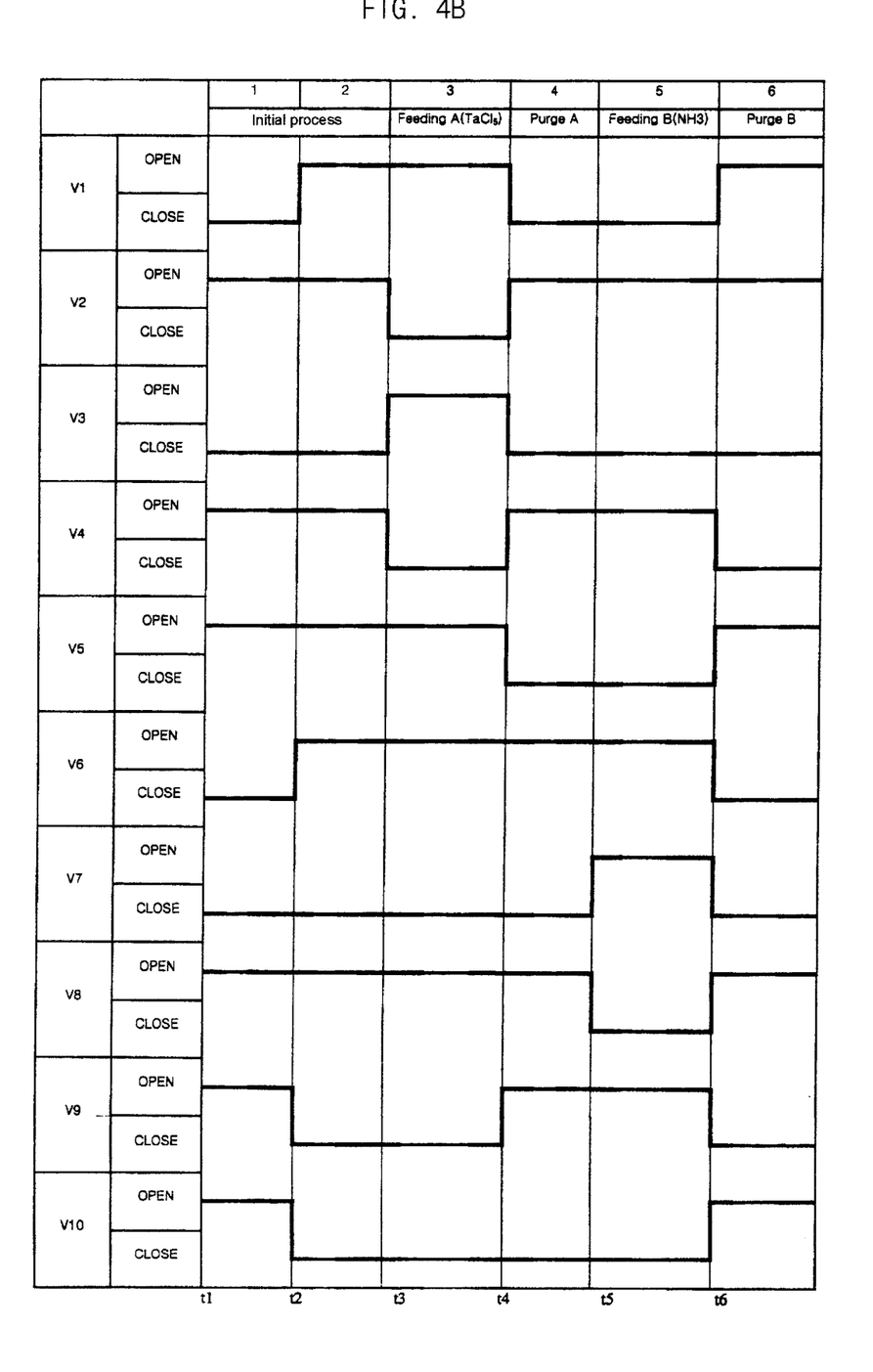

With reference to FIG. 4, there is illustrated the atomic layer using remote plasma in terms of the operational (open/close) states of the controllers V1 to V10 according to the time sequence for supplying reaction materials stepwise.

In FIG. 4, Steps 1 to 6 show a process flow according to time sequence. Preliminary operation steps, represented by Steps 1 and 2, are set to quickly implement the initial process after the introduction of wafers into the reactor. In Steps 3 to 6, which constitute a continuously repeated cycle, 1 feeding/1 purge and 1 feeding/2 purges are carried out with the first reactive gas, the second reactive gas and the cleaning gas at each step according to time sequence. Particularly, FIG. 4a shows the process flow of atomic layer deposition with remote plasma generation being in ON/OFF states, in which the generated remote plasma is introduced into the vacuum chamber and the bypass.

In order to perform the feeding (A) of the second reactive gas vaporized from the solid source of $TaCl_5$, and liquid source of $TiCl_4$, $Ta(OC_2H_5)_5$, $SiCl_4$, $Si_2Cl_6$ to the vacuum chamber, the second reactive gas and the carrier gas are needed. To this end, the valves V1 and V3 are opened under the closed state of the first feeding valve unit 23 (V1, V2, V3, V9, V11) to provide the second reactive gas while only the valve V5 is opened in the purge valve unit 27 (V4, V5 and V13) with the other valves closed for provision of the carrier gas. As for the purge A with inert gas containing $N_2$ and Ar, it can be carried out by opening the valve V4 out of the purge valve unit (V4, V5, V13) to clean the feeding pipe connected to the valve V3. In this regard, valves V2 and V9 are opened (bypass) to maintain the feeding pressure constant while the valves V6 and V8 are opened (bypass) to control the pressure for the second feeding. At this point, V13 of the purge unit is open with V5 remaining closed.

Likewise, the feeding (B) of the first reactive gas ionized by the plasma of $NH_3$ or $H_2$ into the vacuum chamber is performed with the aid of the carrier gas. To this end, only the valves V6 and V7 are opened under the closed state of the second feeding valve unit 25 (V6, V7, V8, V10) to provide the gas ionized by plasma, while only the valve V4 is opened in the purge valve unit 27 (V4, V5 and V13) with the other valves closed for provision of the carrier gas. In this regard, valves V2 and V9 are opened (bypass) to maintain the feeding pressure constant. For the purge (B), only the valve V5 out of the purge valve unit (V4, V5, V13) is opened to clean the feeding pipe connected to the valve V7. As for pressure control upon feeding of reactive gases, it is achieved by opening the valves V1 and V2 for the first feeding and the valves V8 and V10 for the second feeding.

Referring to FIG. 4b, the atomic layer deposition is carried out with plasma generated stably and continuously. As seen in FIG. 4b, valve control is conducted in such a way as to maintain the pressure of the energy supplier constant.

The same process as illustrated in FIG. 4a is applied to the atomic layer deposition under the ON state of plasma generation, except that, after the feeding (B) of the gas ionized by plasma of $NH_3$, only the valve V5 of the purge valve unit (V4, V5, V13) is opened to clean the feeding pipe connected to the valve V7 in the purge step (B). In this regard, as for pressure control upon feeding of reactive gases, it is achieved by opening the valves V1 and V2 for the first feeding and the valves V8 and V10 for the second feeding.

Therefore, various thin films (Ti, TiN, Ta, TaN, SiN) can be deposited on wafers in the vacuum chamber of the atomic layer deposition apparatus using remote plasma. When the atomic layer deposition process is performed in cycles, the thin film to be deposited can be desirably adjusted in thickness. After one cycle of the process, the thin film is formed at ones of Angstrom.

In the present invention, the deposition of Ti, TiN, Ta, TaN and SiN thin films is performed by use of reactive gases comprising $NH_3$ or $H_2$, and any one of a solid source of $TaCl_5$ and a liquid source of $TiCl_4$, $Ta(OC_2H_5)_5$, $SiCl_4$ or $Si_2Cl_6$, in combination with an inert gas in accordance with the time sequence suggested in FIGS. 4a and 4b.

As described hereinbefore, reactive materials for use in the formation of oxide, nitride and metal thin films through atomic layer deposition can be supplied at low temperatures, instead of by use of high heat energy, in the process and apparatus using remote plasma of the present invention, thereby yielding thin films almost free of impurities. Particularly, the use of the excited reactive gas restrains the formation of impurities in addition to allowing the formation of thin films at low temperatures, thereby improving the production yield.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An apparatus for depositing a thin film using remote plasma, in which a first reactive gas and a second reactive gas is fed with the aid of a carrier gas into a vacuum chamber, said apparatus comprising:

a plurality of transfer pipes interconnected with a plurality of valves for individually transferring the first and the second reactive gas and the carrier gas to the vacuum chamber, said plurality of transfer pipes comprising a first pipe line carrying said first reactive gas to said vacuum chamber and a second pipe line carrying a second reactive gas to said vacuum chamber, said first pipe line being separated from said second pipe line;

an energy supplier, provided inside the plurality of transfer pipes, said energy supplier supplying excitation energy to generate excited plasma to ionize the first reactive gas prior to introduction of said first reactive gas into said vacuum chamber; and a valve controller controlling said plurality of valves established in the transfer pipes, the controller being programmed and configured to alternately feed into the vacuum chamber the second reactive gas and the first reactive gas ionized to said plasma at predetermined time intervals.

2. The apparatus as set forth in claim 1, wherein the energy supplier functions as a plasma generator by generating a high frequency to ionize the first reactive gas to said plasma.

3. The apparatus of claim 1, said thin film being formed by a process comprising the steps of:

feeding said first reactive gas, said second reactive gas and said carrier gas in an initial process to prepare for deposition;

feeding said second reactive gas into said vacuum thereby to deposit a substance on a substrate in said reaction chamber;

purging said plurality of transfer pipes using said carrier gas;

feeding said first reactive gas into said vacuum chamber;

purging said plurality of transfer pipes using said inert gas; and repeating the above process of alternately introducing said second reactive gas, purging and then introducing said first reactive gas into said reaction chamber thereby producing said thin film on a substrate, said first reactive gas being ionized into a plasma prior to introduction of said first reactive gas into said vacuum chamber, said first reactive gas never mixing with the second reactive gas.

4. The apparatus of claim 1, said thin film being formed by a process comprising the steps of:

ionizing said first reactive gas to plasma prior to introduction to a vacuum chamber by use of a high frequency, the first reactive gas containing N or H;

preparing said carrier gas;

preparing said unexcited, second reactive gas;

feeding the first reactive gas, the second reactive gas, and the carrier gas in such a way that the first reactive gas and the second reactive gas are delivered to said vacuum chamber in an alternating manner and the carrier gas is provided between the feeding of the first reactive gas and the second reactive gas, said first reactive gas being introduced into said vacuum chamber as an excited ionized plasma, whereby a thin film is formed to a predetermined thickness on a wafer in said vacuum chamber.

5. The apparatus of claim 1, said valve controller controlling said plurality of valves so that when said first ionized reactive gas is being introduced into said vacuum chamber, said first reactive gas is introduced into said vacuum chamber at the exclusion of the second reactive gas and when said second reactive gas is introduced into said vacuum chamber, said second reactive gas is introduced at the exclusion of said first reactive gas.

6. An apparatus for depositing a thin film on a wafer in a vacuum chamber using remote plasma, comprising:

a plasma generator for ionizing a first reactive gas to plasma with the excitation energy supplied by a high frequency, said first reactive gas containing N or H gas, the plasma being introduced directly into said vacuum chamber;

a reactive gas feeder for feeding a second reactive, said second reactive gas being directly introduced into said vacuum chamber;

a purge gas feeder for feeding an inert gas;

a plurality of valves; and a valve controller, controlling said plurality of valves, programmed and configured to automatically feed the first reactive gas and the second reactive gas in an alternating manner alternately into the vacuum chamber and provide an inert gas between the feeding of the first reactive gas and the second reactive gas, said first reactive gas being ionized by the plasma of the plasma generator prior to introduction into said vacuum chamber.

7. The apparatus as set forth in claim 6, wherein the first reactive gas is selected from a group consisting of $NH_3$ and $H_2$ and the second reactive gas is selected from a group consisting of $TaCl_5$, $TiCl_4$, $Ta(OC_2H_5)_5$, $SiCl_4$ and $Si_2Cl_6$.

8. The apparatus as set forth in claim 7, wherein the excited, first reactive gas, the unexcited second reactive gas and the deposited film respectively are selected from a group consisting of $NH_3$, $TiCl_4$ and TiN; $NH_3$, $TaCl_5$ and TaN; $NH_3$, $SiCl_4$ and SiN; $H_2$, $TaCl_5$ and Ta; $H_2$, $Ta(OC_2H_5)_5$ and Ta; $NH_3$, $Ta(OC_2H_5)_5$ and TN; and $NH_3$, $Si_2Cl_6$ and SiN.

9. The apparatus as set forth in claim 7, wherein the plurality of valves comprises:

a first feeding valve unit for feeding the unexcited, second reactive gas to a wafer placed in a vacuum chamber;

a second feeding valve unit for feeding to the wafer the first reactive gas ionized by the plasma of the plasma generator; and a purge valve unit for feeding said inert gas after the operation of the first feeding valve unit and the second feeding valve unit.

10. The apparatus as set forth in claim 6, where the first reactive excited gas in the plasma generator, the unexcited second reactive gas, and the inert gas are provided under the control of the plurality of valves and the valve controller, and the thin film is deposited by performing a provision cycle consisting of the sequential feeding of the second reactive gas, the first reactive gas, and the inert gas, once or many times.

11. The apparatus as set forth in claim 10, wherein the thin film is formed on the wafer to a thickness of ones of Angstrom after one provision cycle and to a desired thickness after one or more provision cycles.

12. The apparatus of claim 6, said thin film being formed by a process comprising the steps of:
- feeding said first reactive gas, said second reactive gas and said inert gas in an initial process to prepare for deposition;
- feeding said second reactive gas into said vacuum thereby to deposit a substance on a substrate in said reaction chamber;
- purging a plurality of transfer pipe lines interconnected to said plurality of valves using said inert gas;
- feeding said first reactive gas into said vacuum chamber;
- purging said plurality of transfer pipes using said inert gas; and
- repeating the above process of alternately introducing said second reactive gas, purging and then introducing said first reactive gas into said reaction chamber thereby producing said thin film on a substrate, said first reactive gas being ionized into a plasma prior to introduction of said first reactive gas into said vacuum chamber.

13. The apparatus of claim 6, said thin film being formed by a process comprising the steps of:
- ionizing said first reactive gas to plasma prior to introduction to a vacuum chamber by use of a high frequency, the first reactive gas containing N or H;
- preparing said inert gas;
- preparing said unexcited, second reactive gas;
- feeding the first reactive gas, the second reactive gas, and the inert gas in such a way that the first reactive gas and the second reactive gas are delivered to said vacuum chamber in an alternating manner and the inert gas is provided between the feeding of the first reactive gas and the second reactive gas, said first reactive gas being introduced into said vacuum chamber as an excited ionized plasma, whereby a thin film is formed to a predetermined thickness on a wafer in said vacuum chamber.

14. The apparatus of claim 6, said valve controller controlling said plurality of valves so that no more than one of said first reactive gas and said second reactive gas enters said vacuum chamber at any time.

15. The apparatus of claim 6, said apparatus being absent a mixing chamber mixing said first reactive gas and said second reactive gas prior to introduction into said vacuum chamber.

* * * * *